(12) United States Patent
Kumagai et al.

(10) Patent No.: US 6,407,463 B2
(45) Date of Patent: Jun. 18, 2002

(54) SEMICONDUCTOR MEMORY DEVICE HAVING GATE ELECTRODE, DRAIN-DRAIN CONTACT, AND DRAIN-GATE CONTACT LAYERS

(75) Inventors: Takashi Kumagai, Chino; Masahiro Takeuchi, Sakata; Satoru Kodaira, Chino; Takafumi Noda, Sakata, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/736,386

(22) Filed: Dec. 15, 2000

(30) Foreign Application Priority Data

Dec. 20, 1999 (JP) .......................................... 11-360378

(51) Int. Cl.[7] .............................................. H01L 27/11
(52) U.S. Cl. ........................ 257/903; 257/368; 257/369; 365/205
(58) Field of Search ........................... 257/903, 68, 69, 257/71, 369; 365/154, 161

(56) References Cited

U.S. PATENT DOCUMENTS 5,521,860 A * 5/1996 Ohkubo ...................... 365/154
6,147,385 A * 11/2000 Kim et al. ................... 257/369

FOREIGN PATENT DOCUMENTS

| JP | 10-41409 | 2/1998 |
| JP | 10-178110 | 6/1998 |

OTHER PUBLICATIONS

M. Ishida et al. IEDM Technical Digest (1998); p. 203 (Dec.).

* cited by examiner

*Primary Examiner*—David Nelms
*Assistant Examiner*—Tu-Tu Ho
(74) *Attorney, Agent, or Firm*—Oliff & Berridge PLC

(57) ABSTRACT

The drain of a drive transistor $Q_3$ and the drain of a load transistor $Q_5$ are connected by a first drain—drain contact layer. The drain of a drive transistor $Q_4$ and the drain of a load transistor $Q_6$ are connected by a second drain—drain contact layer. The gate electrodes of the drive transistor $Q_3$ and the load transistor $Q_5$ (a first gate electrode layer) are connected to the second drain—drain contact layer by a first drain-gate contact layer. The gate electrodes of the drive transistor $Q_4$ and the load transistor $Q_6$ (a second gate electrode layer) are connected to the first drain—drain contact layer by a second drain-gate contact layer.

20 Claims, 17 Drawing Sheets

RELATED ART

SEMICONDUCTOR MEMORY DEVICE HAVING GATE ELECTRODE, DRAIN-DRAIN CONTACT, AND DRAIN-GATE CONTACT LAYERS

BACKGROUND OF THE INVENTION

1. Field of the Invention

The present invention relates to a semiconductor memory device such as static random access memory (SRAM).

2. Description of the Related Art

SRAM, which is one variety of semiconductor memory device, does not require any refresh operation and thus can be used for implementing simpler systems with lower power consumption. That is why SRAM is suitable for use as memory in portable equipment such as cellular telephones.

There is a demand for portable equipment that is even more compact, and the memory cell size of SRAM must be made smaller to address that demand.

SUMMARY OF THE INVENTION

An objective of the present invention is to provide a semiconductor memory device that makes it possible to reduce the memory cell size.

A semiconductor memory device in accordance with the present invention relates to a semiconductor memory device which stores data by a flip-flop configured of a first inverter and a second inverter, the semiconductor memory device comprising:

a first gate electrode layer and a second gate electrode layer;

a first drain-drain contact layer and a second drain-drain contact layer; and a first drain-gate contact layer and a second drain-gate contact layer, wherein each of the first and second inverters comprises a load transistor and a drive transistor, wherein each of the first and second gate electrode layers comprises gate electrodes of the load transistor and the drive transistor, wherein each of the first and second drain-drain contact layers connects a drain of the load transistor to a drain of the drive transistor, wherein the first and second gate electrode layers are positioned between the first drain-drain contact layer and the second drain-drain contact layer, wherein the first drain-gate contact layer connects the first drain-drain contact layer to the second gate electrode layer, wherein the second drain-gate contact layer connects the second drain-drain contact layer to the first gate electrode layer, and wherein the first and second drain-gate contact layers, the first and second drain-drain contact layers, and the first and second gate electrode layers are each formed in different layers.

The semiconductor memory device in accordance with the invention makes it possible to reduce the memory cell size. The reasons therefor are discussed below. A flip-flop is configured by connecting an input terminal (gate electrode) of a first inverter to an output terminal (drain) of a second inverter, and by connecting an input terminal (gate electrode) of the second inverter to an output terminal (drain) of the first inverter. In other words, the flip-flop is configured by cross-coupling the first inverter and the second inverter.

When the flip-flop is fabricated in two layers, the cross-coupling connection could be enabled by having the drain-drain contact layer for connecting together the drains of the inverters and the drain-gate contact layer for connecting the gate of one inverter to the drain of the other inverter in the same layer, by way of example.

However, such a configuration would mean that this conductive layer would be formed to extend over a region in which the drain of the first inverter is positioned, a region in which the gate of the second inverter is positioned, and a connecting region therebetween. Thus, this conductive layer would require a pattern having three end portions (such as a pattern with branch points, such as a T-shaped or small h-shaped pattern) or a spiral pattern with interlocking arm portions. Note that an example of a T-shaped pattern is disclosed in FIG. 1 of Japanese Patent Application Laid-Open No. 10-41409. An example of a small h-shaped pattern is disclosed in FIG. 4(b) on page 203 of "the IEDM Tech. Digest (1998)", by M. Ishida, et al. An example of a spiral pattern is disclosed in FIG. 3(b) on page 203 of "the IEDM Tech. Digest (1998)", by M. Ishida, et al.

If such a complicated pattern is reduced in size, it would be difficult to reproduce that shape accurately in a photo-etching step, so that the desired pattern will not be obtained and thus it will not be possible to reduce the memory cell size.

In a semiconductor memory device in accordance with the present invention, a gate electrode layer that forms gates for the inverters, a drain-drain contact layer that connects together the drains of the inverters, and a drain-gate contact layer that connects the gate of the first inverter to the drain of the second inverter are formed in different layers. In this manner, the semiconductor memory device in accordance with the present invention uses three layers in the fabrication of the flip-flop. This makes it possible to simplify the pattern of each layer (by making them linear, by way of example), in comparison with a flip-flop formed by using two layers.

In the above described manner, a semiconductor memory device in accordance with this aspect of the present invention makes it possible to simplify the pattern of each layer and thus create a semiconductor memory device having a memory cell size with dimensions of 4.5 $\mu m^2$ or less.

In the semiconductor memory device in accordance with the present invention, first and second gate electrode layers are positioned between the first drain-drain contact layer and the second drain-drain contact layer. This makes it possible to dispose the source contact of each drive transistor in the center of the memory cell. This increases the degree of freedom in the fabrication of the first and second drain-gate contact layers, which further helps in reducing the memory cell size.

It is possible to apply this aspect of the present invention with the above-described configuration to a semiconductor memory device having a memory cell that comprises a plurality of transfer transistors and a flip-flop configured of first and second inverters.

In the semiconductor memory device in accordance with the present invention, the first gate electrode layer, the second gate electrode layer, the first drain-drain contact layer, and the second drain-drain contact layer may be disposed to be mutually parallel and each may form a linear pattern.

This configuration makes it possible to simplify the patterning, thus enabling a semiconductor memory device with a smaller memory cell size.

The semiconductor memory device in accordance with the present invention may further comprise:

a first contact conductive portion and a second contact conductive portion, and the first contact conductive portion may be formed in a hole and is connected to the second gate electrode layer, the second contact conductive portion may be formed in a hole and is connected to the first gate electrode layer, the first drain-gate contact layer may be connected to the first contact conductive portion, the second drain-gate contact layer may be connected to the second contact conductive portion, the first and second contact conductive portions may be positioned between the first drain-gate contact layer and the second drain-gate contact layer, the first contact conductive portion may be positioned closer to the first drain-gate contact layer than the second contact conductive portion, and the second contact conductive portion may be positioned closer to the second drain-gate contact layer than the first contact conductive portion.

In this configuration, the first contact conductive portion is positioned closer to the first drain-gate contact layer than the second contact conductive portion and the second contact conductive portion is positioned closer to the second drain-gate contact layer than the first contact conductive portion. Thus the distance between the first drain-gate contact layer and the second drain-gate contact layer can be reduced in this configuration making it possible to reduce the size of the memory cell. This will be described in more detail in the section on an embodiment of the present invention.

In the semiconductor memory device in accordance with the present invention, each of the first and second drain-gate contact layers may have a pattern including a first side and a second side, a first side of the first drain-gate contact layer may face a first side of the second drain-gate contact layer, and a second side of the first drain-gate contact layer may face a second side of the second drain-gate contact layer.

Since this configuration makes it possible to reduce the distance between the first drain-gate contact layer and the second drain-gate contact layer, and the shapes of the first and second drain-gate contact layers are simple and thus easy to fabricate, it is possible to reduce the size of the memory cell.

In the semiconductor memory device in accordance with the present invention, the load transistor may be a p-type transistor, the drive transistor may be an n-type transistor, and an n-type of transfer transistor may be further provided.

The semiconductor memory device in accordance with the present invention may further provide, a first conductive layer, a second conductive layer, a third conductive layer, and a fourth conductive layer, and the first conductive layer may include:
  the gate electrode layer; and
  a sub word line extending in a first direction, the second conductive layer may include:
  the drain- drain contact layer;
  a power line connected to the load transistor;
  a first contact pad layer used for connecting a bit line to an n-type source/drain of the transfer transistor; and
  a second contact pad layer used for connecting a ground line to a p-type well and to an n-type source of the drive transistor, the third conductive layer may include:
  the drain-gate contact layer;
  a main word line extending in the first direction;
  a third contact pad layer used for connecting the bit line to the n-type source/drain of the transfer transistor; and
  a fourth contact pad layer used for connecting the ground line to the p-type well and the n-type source of the drive transistor, and the fourth conductive layer may include:
  the bit line extending in a second direction that is perpendicular to the first direction; and the ground line.

This configuration makes it possible to appropriately improve all the various performance requirements that are requested for semiconductor memory devices (such as reduced size, reliability, stability, and speed).

DESCRIPTION OF THE PREFERRED EMBODIMENT

An embodiment of a semiconductor memory device in accordance with the present invention is described below. In this embodiment of the present invention, the semiconductor memory device is applied to SRAM. An outline of the configuration of this embodiment of the invention is given first; followed by a more detailed description thereof.

Outline of Configuration of This Embodiment

A semiconductor memory device in accordance with this embodiment of the invention is of a type wherein one memory cell is configured of six MOS field-effect transistors. This outline is divided into the configuration of a portion that forms a flip-flop for a memory cell and the configuration of the memory cell.

Configuration of Flip-Flop Components Within Memory Cell

Figure 1:
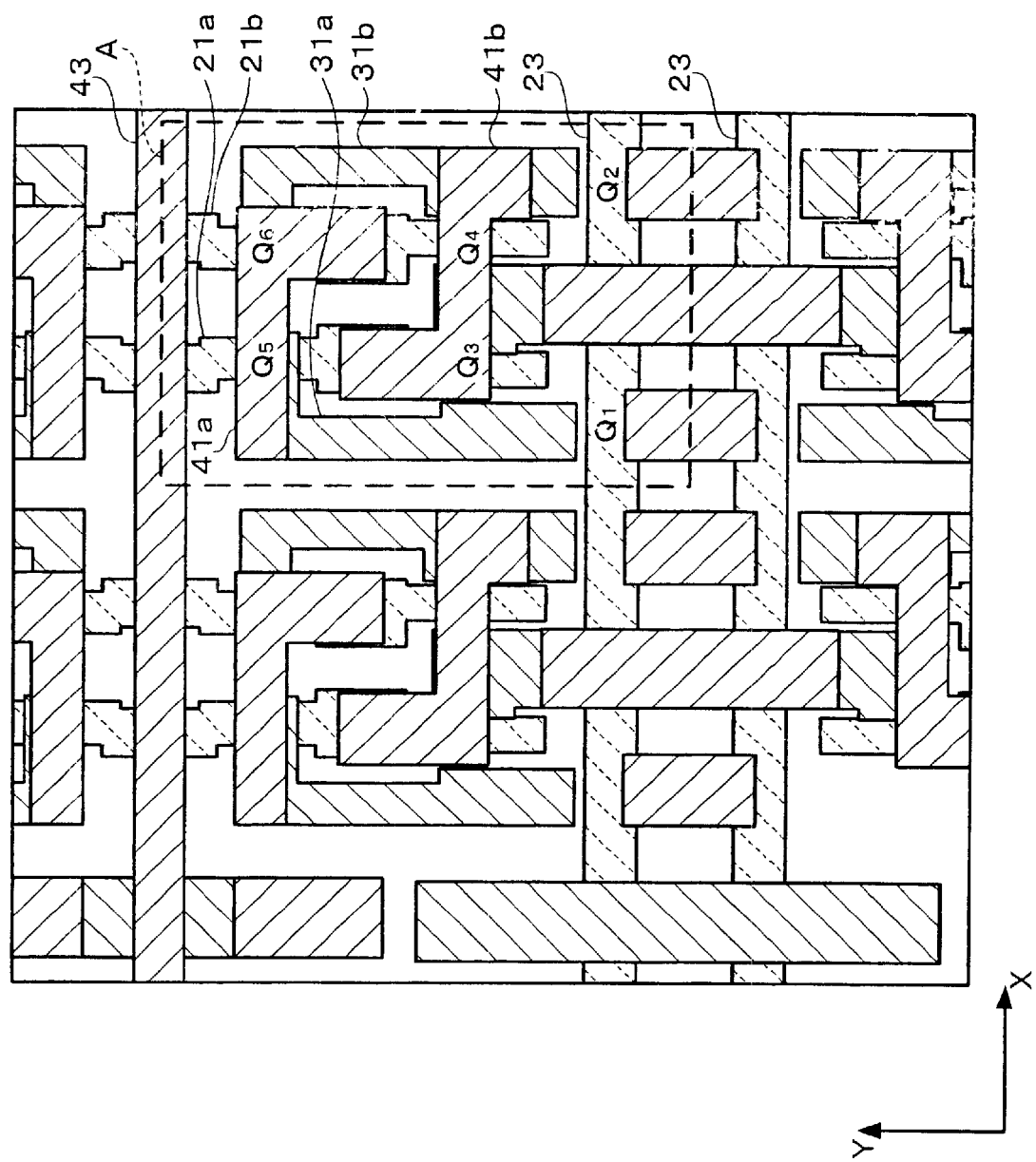
FIG. 1 is a plan view of conductive layers that comprise first, second, and third layers in a part of a memory cell array in accordance with an embodiment of the present invention.

A plan view of first, second, and third conductive layers of part of a memory cell array in accordance with this embodiment of the invention is shown in FIG. 1. To help make FIG. 1 easier to understand, the descriptions of the first, second, and third layers are separated.

Figure 3:
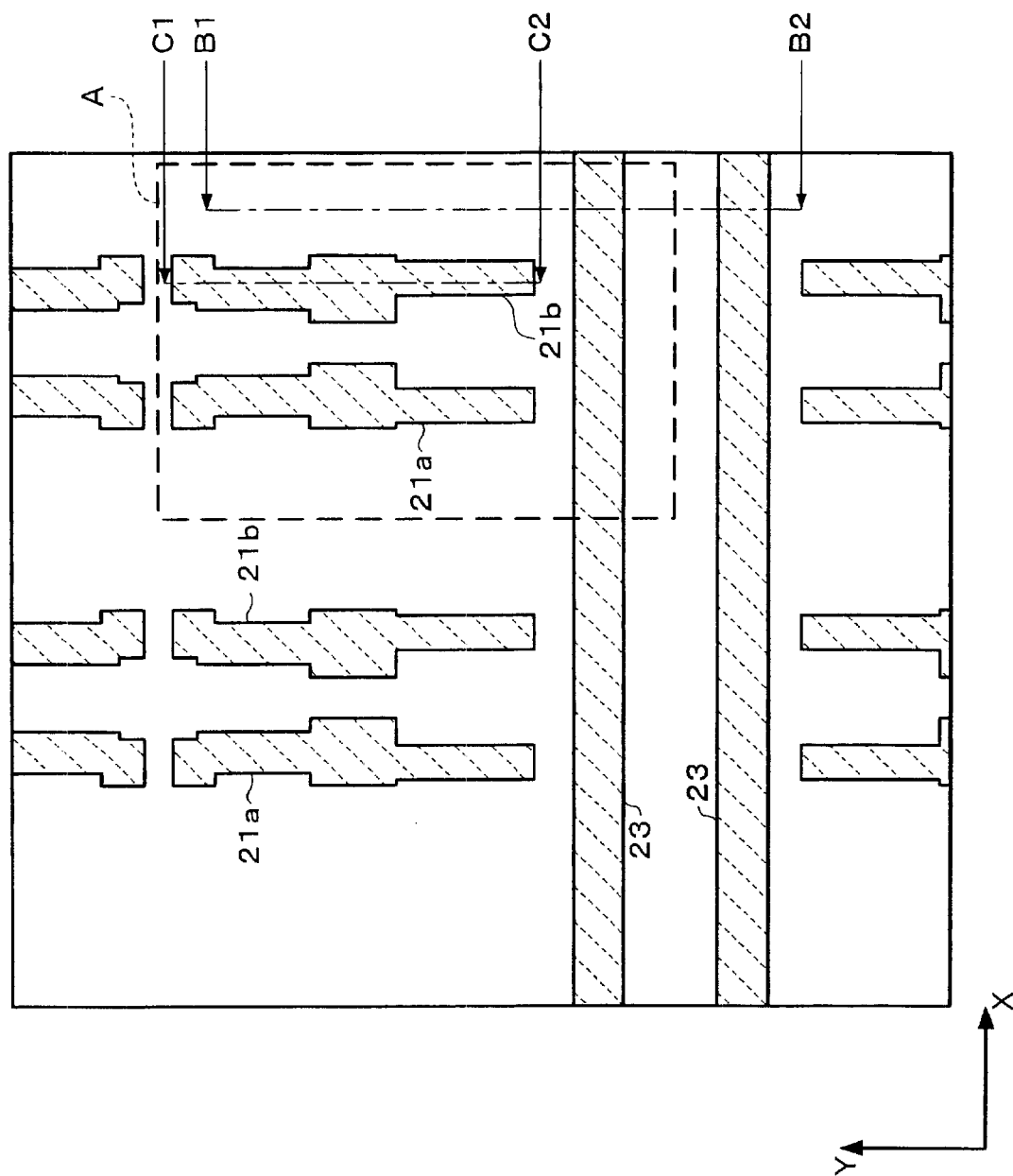
FIG. 3 is a plan view of the first conductive layer in this part of the memory cell array in accordance with this embodiment of the invention.
Figure 5:
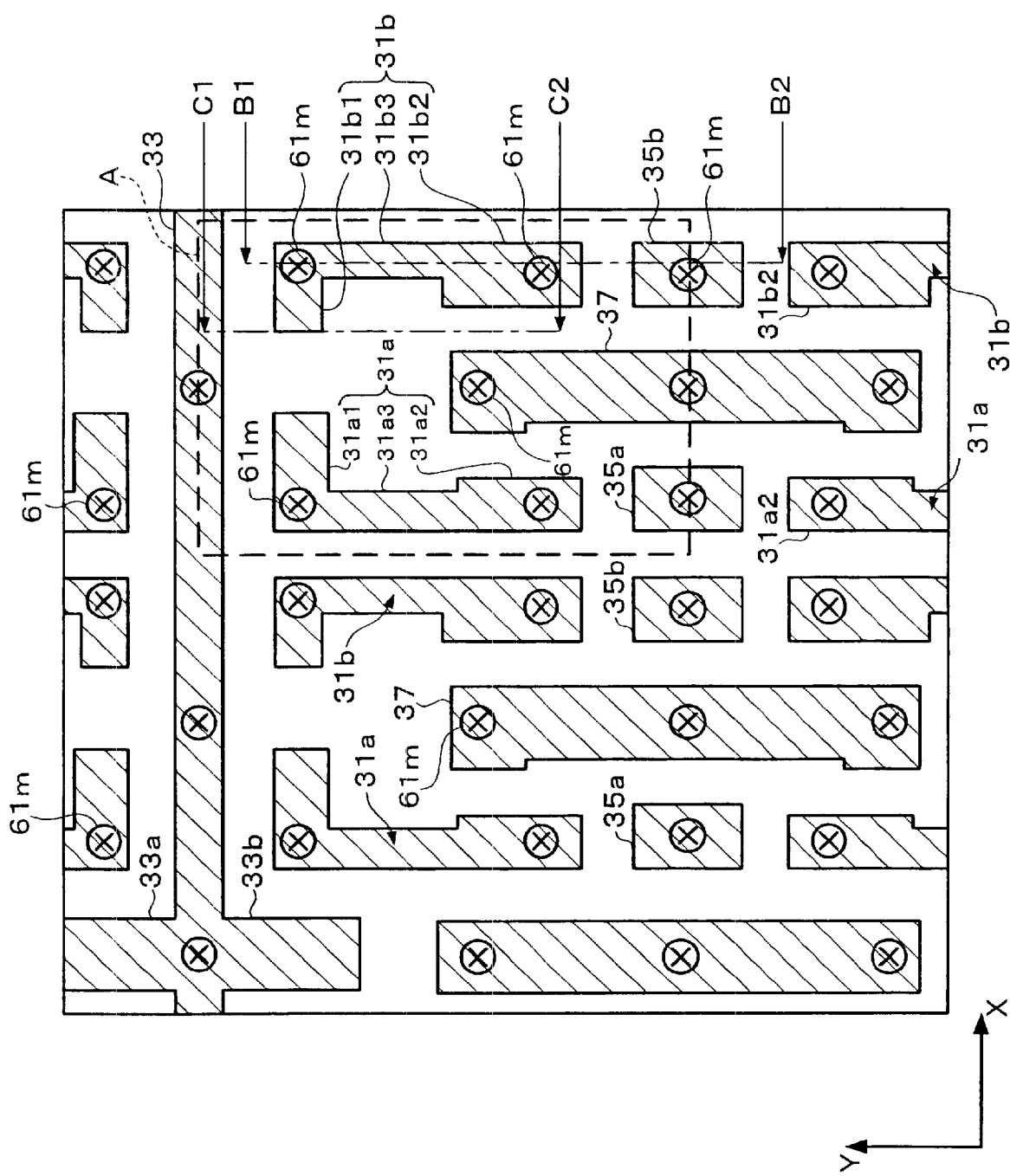
FIG. 5 is a plan view of the second conductive layer in this part of the memory cell array in accordance with this embodiment of the invention.
Figure 8:
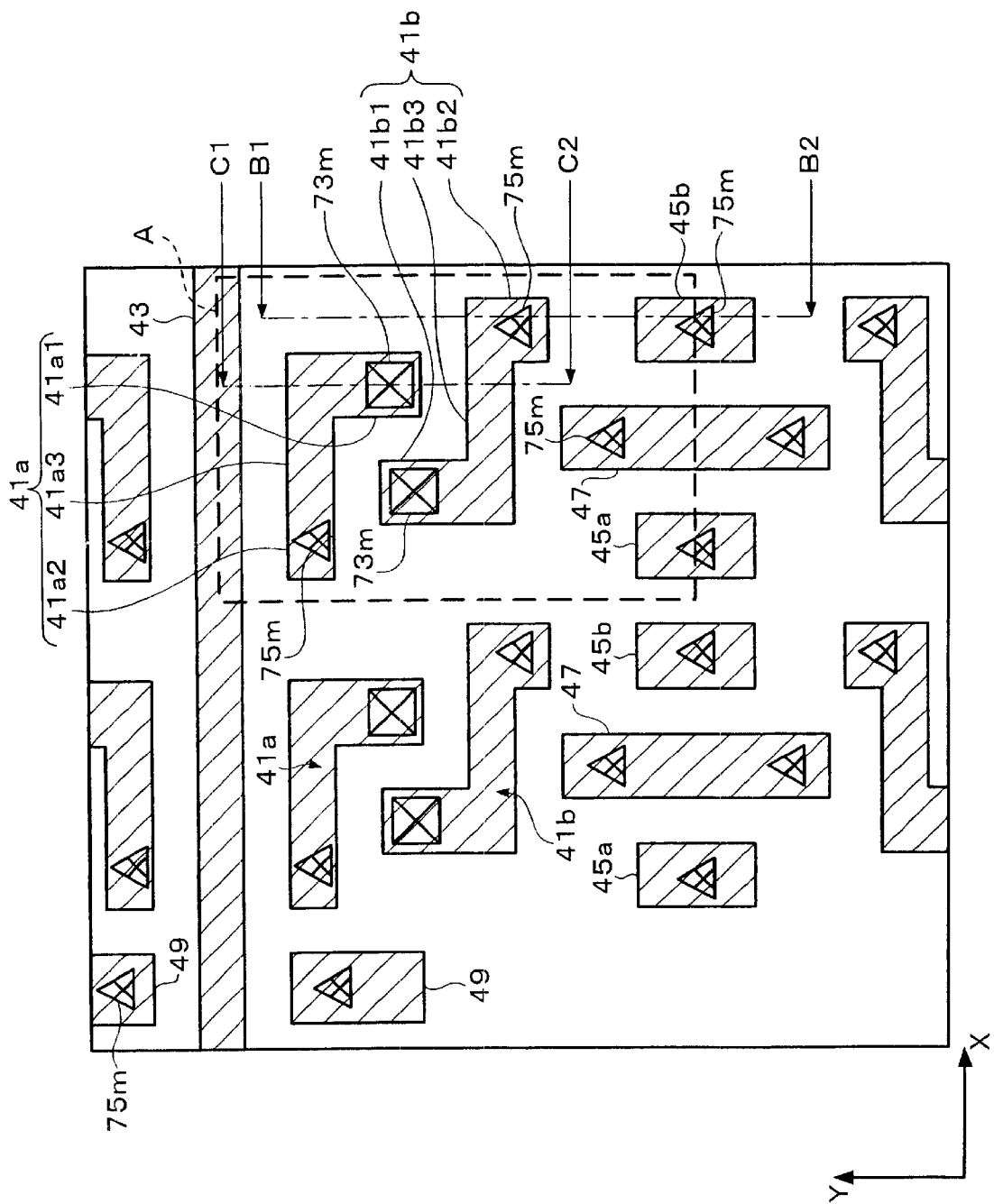
FIG. 8 is a plan view of the third conductive layer in this part of the memory cell array in accordance with this embodiment of the invention.

Gate electrode layers 21a and 21b and sub word lines 23 are disposed in the first layer, as shown in FIG. 3. Drain-drain contact layers 31a and 31b are disposed in the second layer, as shown in FIG. 5. Drain-gate contact layers 41a and 41b are disposed in the third layer, as shown in FIG. 8. The structure shown in FIG. 5 is positioned above the structure shown in FIG. 3, then the structure shown in FIG. 8 is positioned above the structure of FIG. 5. These structures are shown together in FIG. 1.

A portion that configures a flip-flop is shown in FIG. 1. This will be described below, concentrating on a region A. One memory cell is formed in region A. References to region A in other figures have the same meaning.

Figure 17:
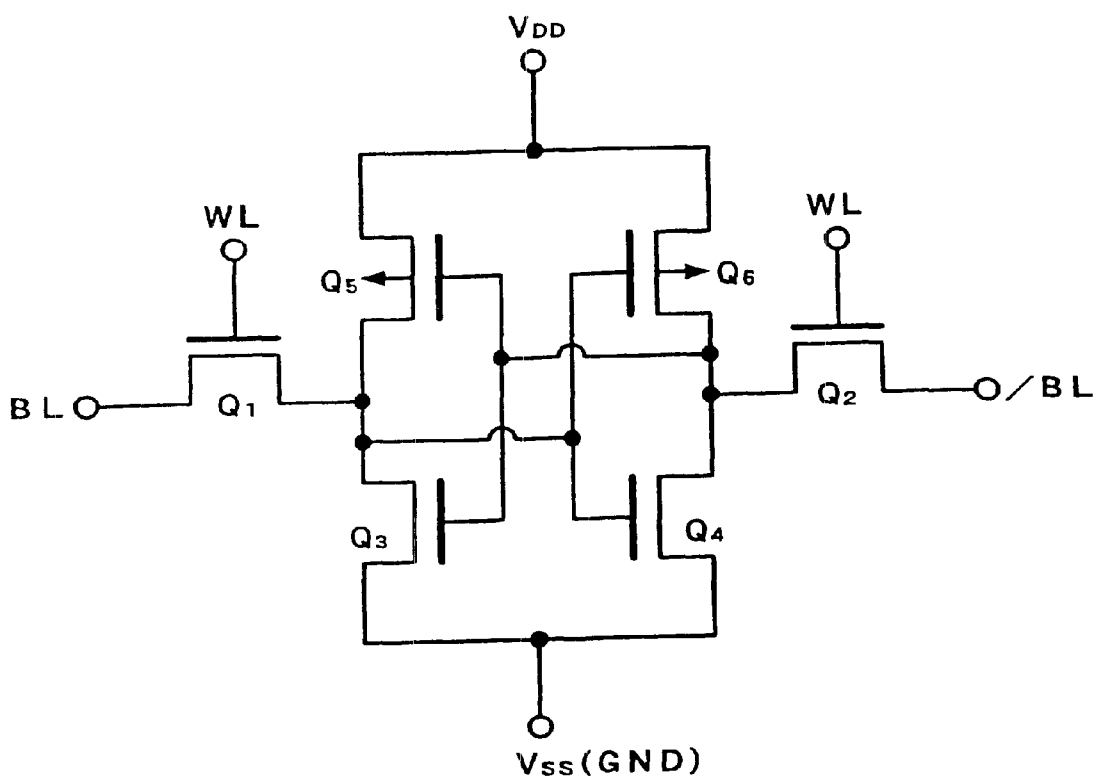
FIG. 17 is an equivalent circuit of SRAM in accordance with this embodiment.

Within region A are formed MOS field-effect transistors, in other words, two n-channel transfer transistors $Q_1$ and $Q_2$, two n-channel drive transistors $Q_3$ and $Q_4$, and two p-channel load transistors $Q_5$ and $Q_6$. One CMOS inverter is formed from the drive transistor $Q_3$ and the load transistor $Q_5$. Another CMOS inverter is formed from the drive transistor $Q_4$ and the load transistor $Q_6$. A flip-flop is formed by cross-coupling these two CMOS inverters. The circuits configured by the six MOS field-effect transistors that are in region A form an equivalent circuit such as that shown in FIG. 17.

Referring once more to FIG. 1, each of the gate electrode layer 21a and the gate electrode layer 21b has a linear shape. The gate electrode layer 21a forms gate electrodes for the drive transistor $Q_3$ and the load transistor $Q_5$, and it also connects those gate electrodes together. Similarly, the gate electrode layer 21b forms gate electrodes for the drive transistor $Q_4$ and the load transistor $Q_6$, and it also connects those gate electrodes together.

The drain of the drive transistor $Q_3$ and the drain of the load transistor $Q_5$ are connected by a drain-drain contact layer 31a. Similarly, the drain of the drive transistor $Q_4$ and the drain of the load transistor $Q_6$ are connected by a drain-drain contact layer 31b. Each of the drain-drain contact layer 31a and the drain-drain contact layer 31b has a linear shape.

The gate electrodes of the drive transistor $Q_3$ and the load transistor $Q_5$ (i.e., the gate electrode layer 21a) are connected to the drain-drain contact layer 31b by a drain-gate contact layer 41b. Similarly, the gate electrodes of the drive transistor $Q_4$ and the load transistor $Q_6$ (i.e., the gate electrode layer 21b) are connected to the drain-drain contact layer 31a by a drain-gate contact layer 41a. The drain-gate contact layer 41a forms an L-shaped pattern and the drain-gate contact layer 41b forms Z-shaped pattern. The angle formed by a first side and a second side of each L-shaped pattern is substantially 90 degrees. The first side of the drain-gate contact layer 41a faces the first side of the drain-gate contact layer 41b. The second side of the drain-gate contact layer 41a faces the second side of the drain-gate contact layer 41b. The first and the second sides of the drain-gate contact layer 41a and the first and the second sides of the drain-gate contact layer 41b are rotationally symmetrical.

The gate electrode layer 21a, the gate electrode layer 21b, the drain- drain contact layer 31a, and the drain- drain contact layer 31b are disposed to be mutually parallel. The gate electrode layers 21a and 21b are positioned between the drain- drain contact layer 31a and the drain- drain contact layer 31b.

With this embodiment configured as described above, the flip-flop is formed of three layers, simplifying the patterning of each layer and thus making it possible to reduce the size of the resultant SRAM. The reasons therefore are described below. When a flip-flop is configured of two layers, as described previously, the pattern shape of conductive layer that enables the cross-coupling connections will have a T-shaped or small h-shaped configuration with branch points, or a spiral configuration. Such a complicated pattern will be difficult to achieve after a reduction in size, and thus it will not be possible to reduce the memory cell size.

With this embodiment of the invention, the gate electrode layers (21a and 21b) that form the gates of the CMOS inverters, the drain- drain contact layers (31a and 31b) that connect together the drains of the CMOS inverters, and the drain-gate contact layers (41a and 41b) that connect the gate of one CMOS inverter to the drain of the other CMOS inverter are formed in different layers. That is why three layers are used in the formation of the flip-flops mentioned herein. This makes it possible to simplify the pattern of each layer (by making them linear, by way of example), in comparison with a flip-flop formed by using two layers.

Since the pattern of each layer can be simplified in this manner, this embodiment of the invention makes it possible to create even denser SRAM with dimensions on the order of 0.18 $\mu$m, for example, giving a memory cell size of 4.5 $\mu m^2$ or less.

Memory Cell Configuration

Figure 10:
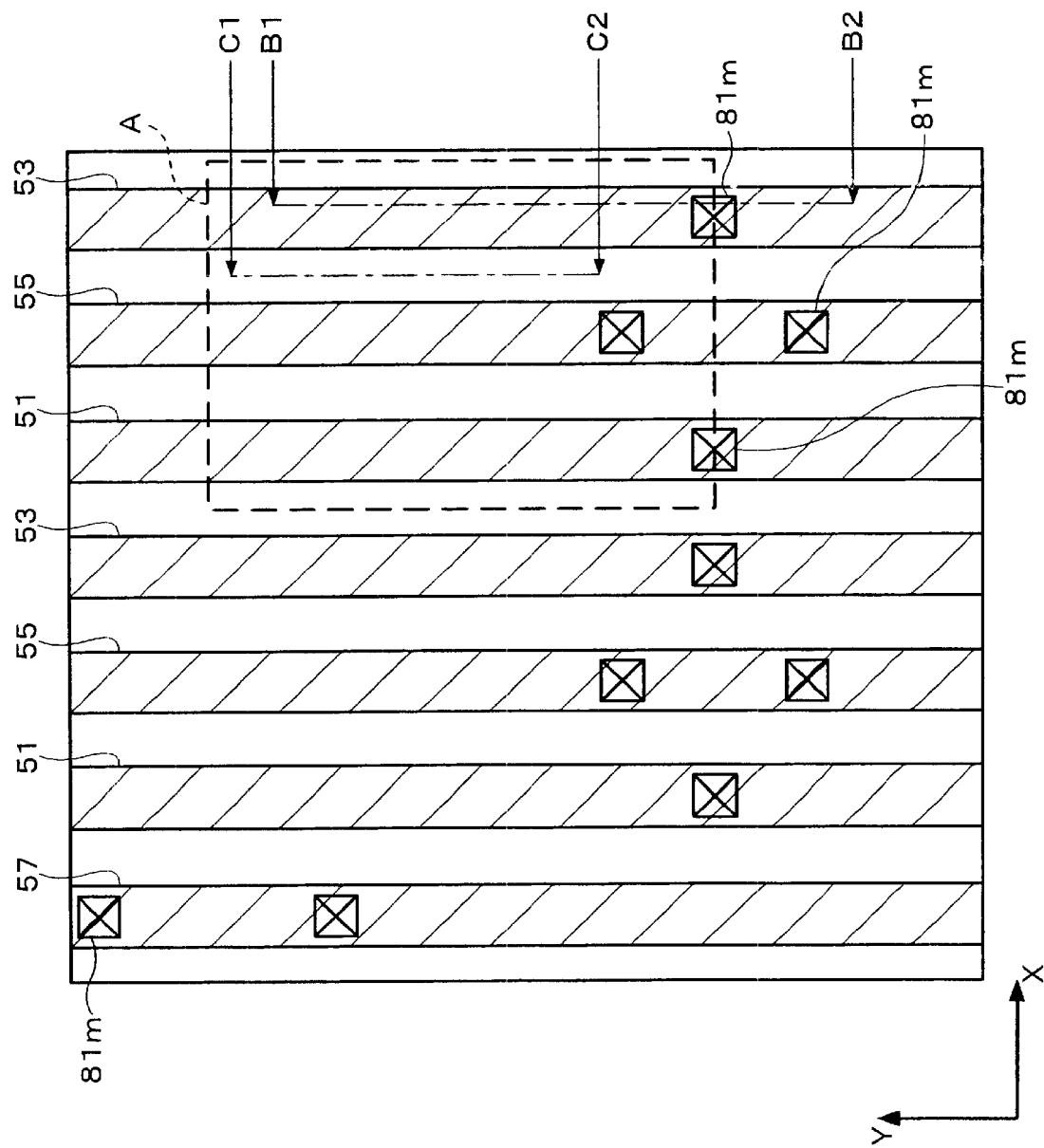
FIG. 10 is a plan view of the fourth conductive layer in this part of the memory cell array in accordance with this embodiment of the invention.

The description now turns to the configuration of the memory cell of this embodiment of the invention. The memory cell of this embodiment has a configuration in which conductive layers that comprise first, second, third, and fourth layers are formed in sequence on a field, with interlayer dielectrics therebetween. This field is a region in which active regions 11, 13, 15, and 17 and element isolation regions 19 are positioned. The fourth layer is a layer in which components such as bit lines 51 are positioned, as shown in FIG. 10. The memory cell of this embodiment of the invention is configured in such a manner that the conductive layers that comprise first, second, and third layers that were described previously with reference to FIG. 1 are positioned on the field shown in FIG. 2, then the fourth conductive layer shown in FIG. 10 is positioned on the top of these.

Detailed Configuration of This Embodiment

Figure 12:
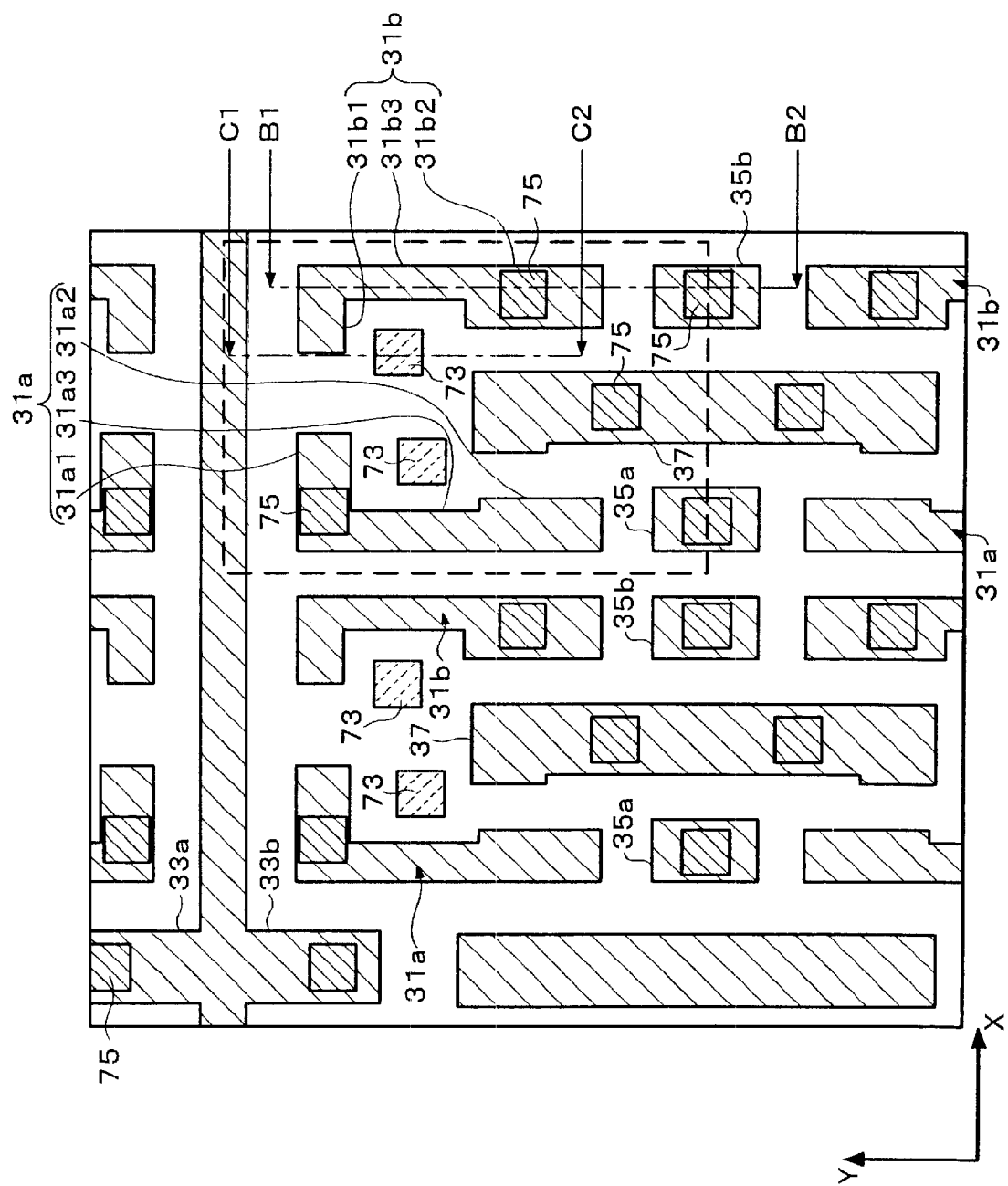
FIG. 12 is a plan view of the second layer and the plugs of this embodiment of the invention.
Figure 13:
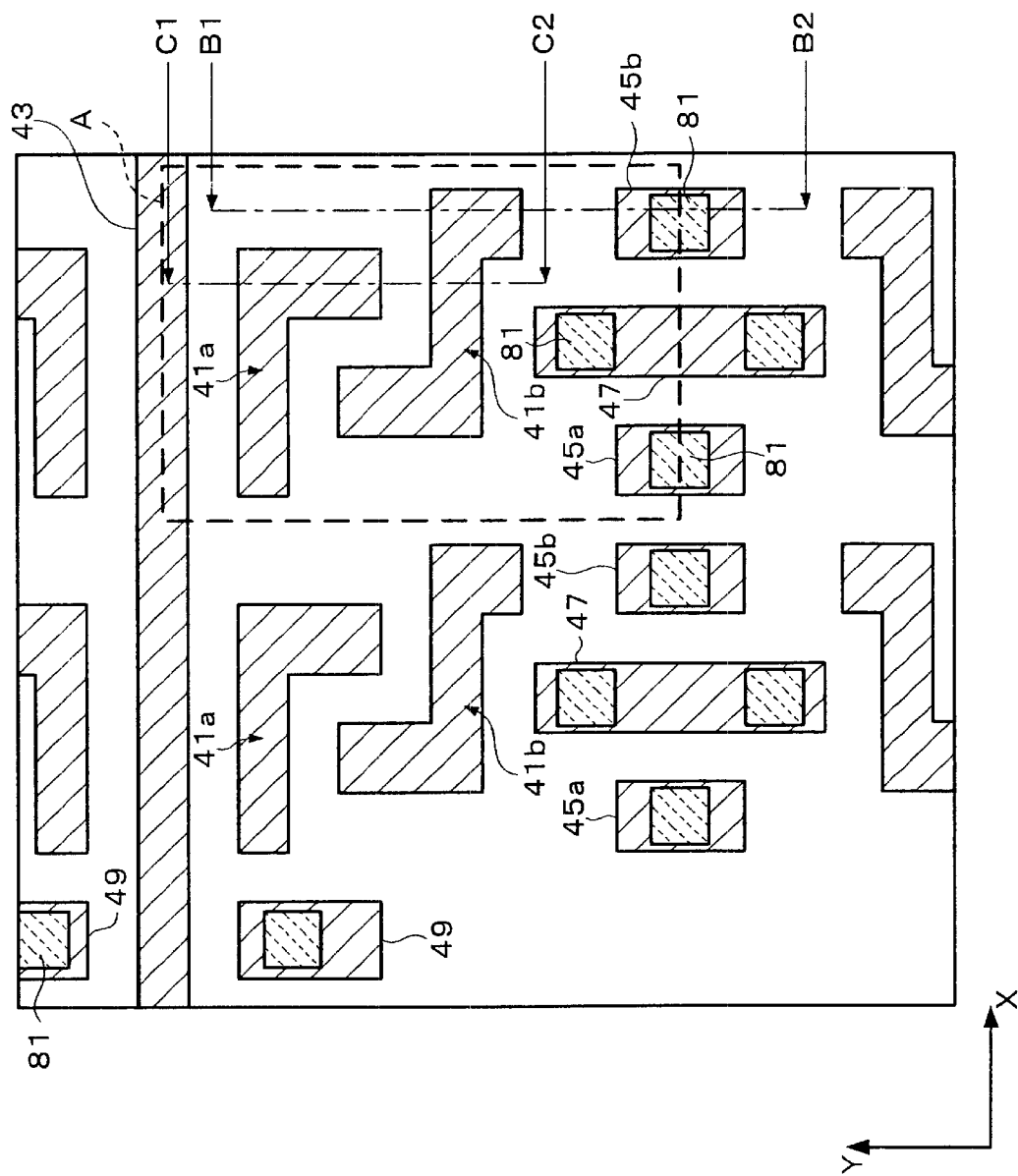
FIG. 13 is a plan view of the third layer and the plugs of this embodiment of the invention.
Figure 14:
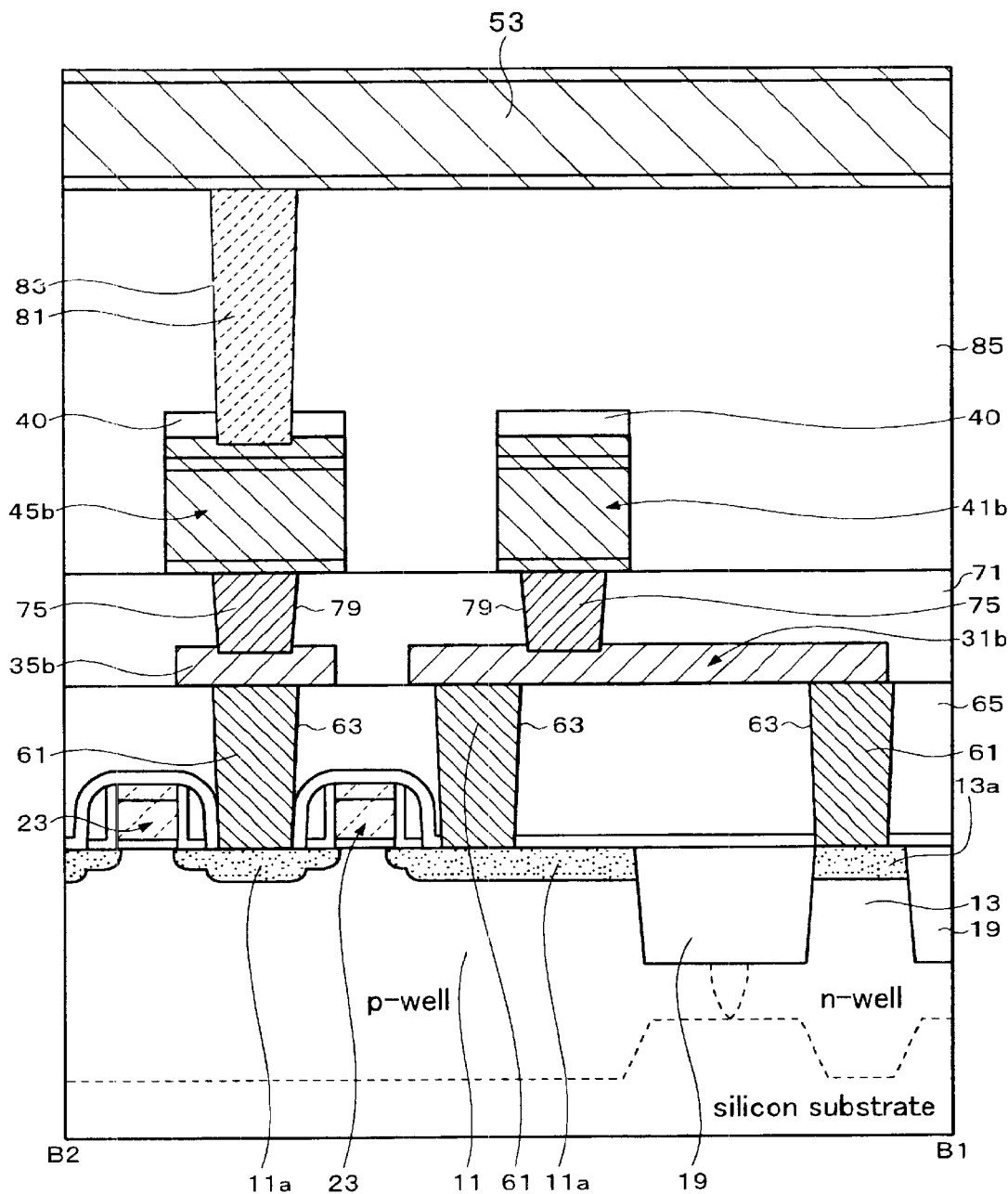
FIG. 14 is a sectional view taken along the line B1–B2 of the plan view of this embodiment.
Figure 15:
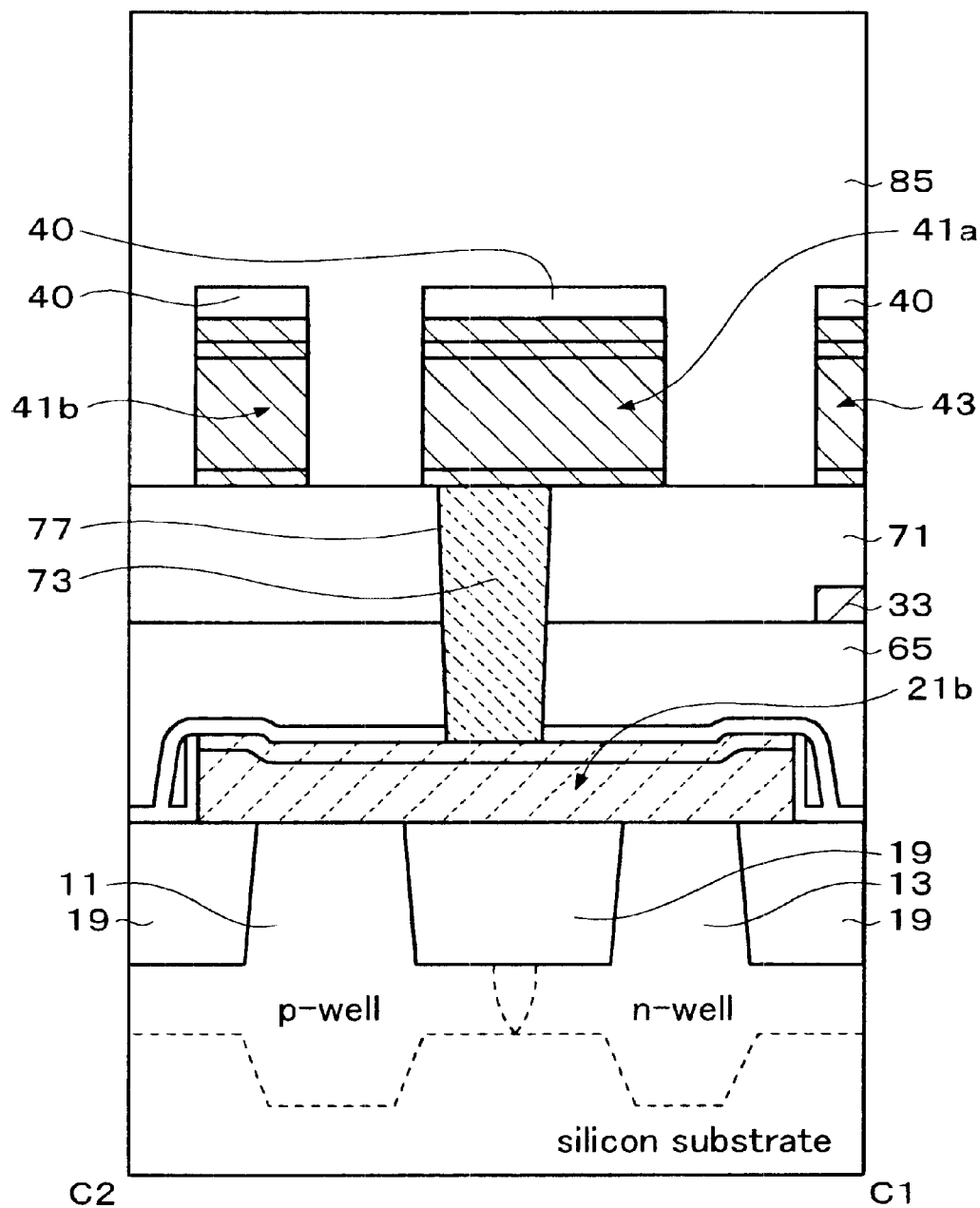
FIG. 15 is a sectional view taken along the line C1–C2 of the plan view of this embodiment.

Details of the configuration of this embodiment of the invention will now be described with reference to FIGS. 2 to 16, in sequence from the lowermost layer. Note that lines B1–B2 and C1–C2 are shown in FIGS. 2 to 13. A section taken along the line B1–B2 is shown in FIG. 14 and a section taken along the line C1–C2 is shown in FIG. 15.

Field and First Conductive Layer

Figure 2:
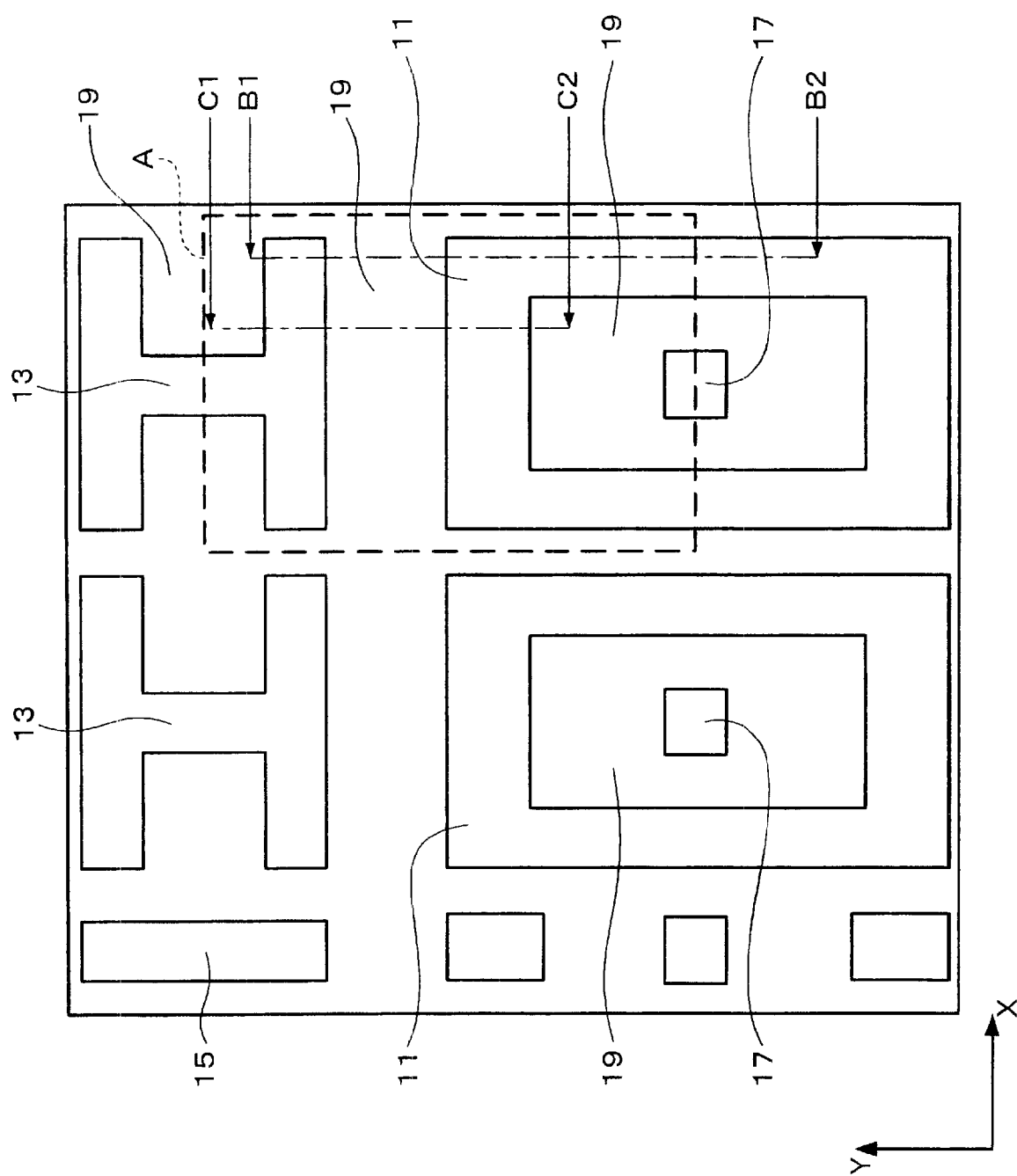
FIG. 2 is a plan view of a field in this part of the memory cell array in accordance with this embodiment of the invention.
Figure 11:
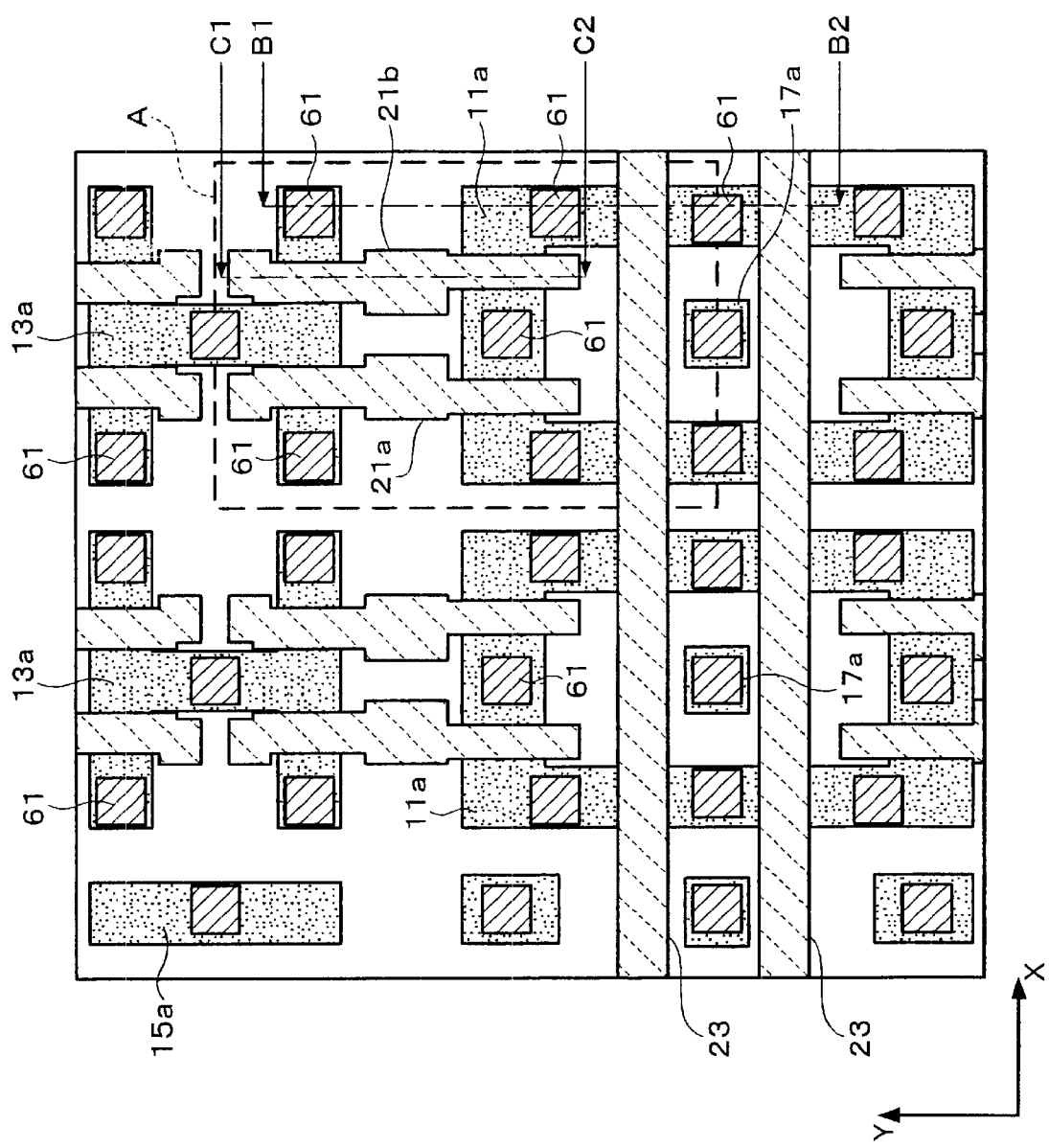
FIG. 11 is a plan view of the field, the first layer and the plugs of this embodiment of the invention.

A plan view of the field and the first conductive layer is shown in FIG. 11. First of all, the field will be described with reference to FIGS. 2, 14, and 15. FIG. 2 is a plan view of the field. The field has the active regions 11, 13, 15, and 17 and the element isolation regions 19. The active regions 11, 13, 15, and 17 are formed in the upper surface of a silicon substrate.

Each active region 11 is substantially box-shaped. A plurality of these active regions 11 is arrayed in the X-axis direction in FIG. 2. The transfer transistors $Q_1$ and $Q_2$ and the drive transistors $Q_3$ and $Q_4$ of FIG. 1 are formed in each active region 11.

Each active region 13 is substantially H-shaped. A plurality of these active regions 13 is arrayed in the X-axis direction in FIG. 2. The load transistors $Q_5$ and $Q_6$ are formed in each active region 13.

The active region 15A is formed for every 32 memory cells. An n-well type of well contact region is formed in this active region 15. Thus, n-wells corresponding to 32 memory cells are connected to a $V_{DD}$ wire (power line) by this well contact region.

The active region 17 is formed for every two memory cells. A p-well type of well contact region is formed in this active region 17. Thus, p-wells corresponding to two memory cells are connected to a $V_{SS}$ wire (ground line) by this well contact region.

Each of the active regions 11, 13, 15, and 17 is separated from all of the other active regions by the element isolation regions 19 (of a depth of 400 nm, for example). The element isolation regions 19 provide shallow trench isolation (STI), by way of example.

Sections taken along the lines B1–B2 and C1–C2 of FIG. 2 are shown in FIG. 14 and FIG. 15, respectively. These sections show the active regions 11 and 13 and the element isolation regions 19.

The first layer, which is positioned on this field, will now be described with reference to FIGS. 3, 11, 14, and 15. FIG. 3 is a plan view of the first conductive layer, showing a plurality of the gate electrode layers 21a and 21b and a plurality of the sub word lines 23 that are disposed in this first layer. The gate electrode layers 21a and 21b and the sub word lines 23 have a configuration formed of a silicide layer on a polysilicon layer, by way of example.

Each of the gate electrode layers 21a and 21b has a linear shape that extends in the Y-axis direction in FIG. 3. A pair of the gate electrode layers 21a and 21b is disposed in parallel within each memory cell region. The gate electrode layers 21a and 21b form the gate electrodes of the drive transistors $Q_3$ and $Q_4$ and the load transistors $Q_5$ and $Q_6$ of FIG. 1. The gate length of the drive transistors $Q_3$ and $Q_4$ is 0.18 µm, by way of example. The gate length of the load transistors $Q_5$ and $Q_6$ is 0.20 µm, by way of example.

Each of the sub word lines 23 has a linear shape that extends in the X-axis direction in FIG. 3. The sub word lines 23 are activated/deactivated by main word lines that are positioned in an upper layer. The sub word lines 23 form the gate electrodes of the transfer transistors $Q_1$ and $Q_2$ of FIG. 1. The gate length of these transistors is 0.24 µm, by way of example.

Sections taken through the first layer along the lines B1–B2 and C1–C2 of FIG. 3 are shown in FIG. 14 and FIG. 15, respectively. These sections show the sub word lines 23 and the gate electrode layer 21b.

The description now turns to the source/drains formed in the active regions. As shown in FIG. 11, an n$^+$-type source/drain 11a is formed in each active region 11. A p$^+$-type source/drain 13a is formed in each active region 13. An n$^+$-type impurity region 15a is formed in the active region 15. This region forms an n-well type of well contact region.

An p$^+$-type impurity region 17a is formed in the active region 17. This region forms a p-well type of well contact region. Note that "source/drain" means as region that can function as either a source or a drain.

Figure 4:
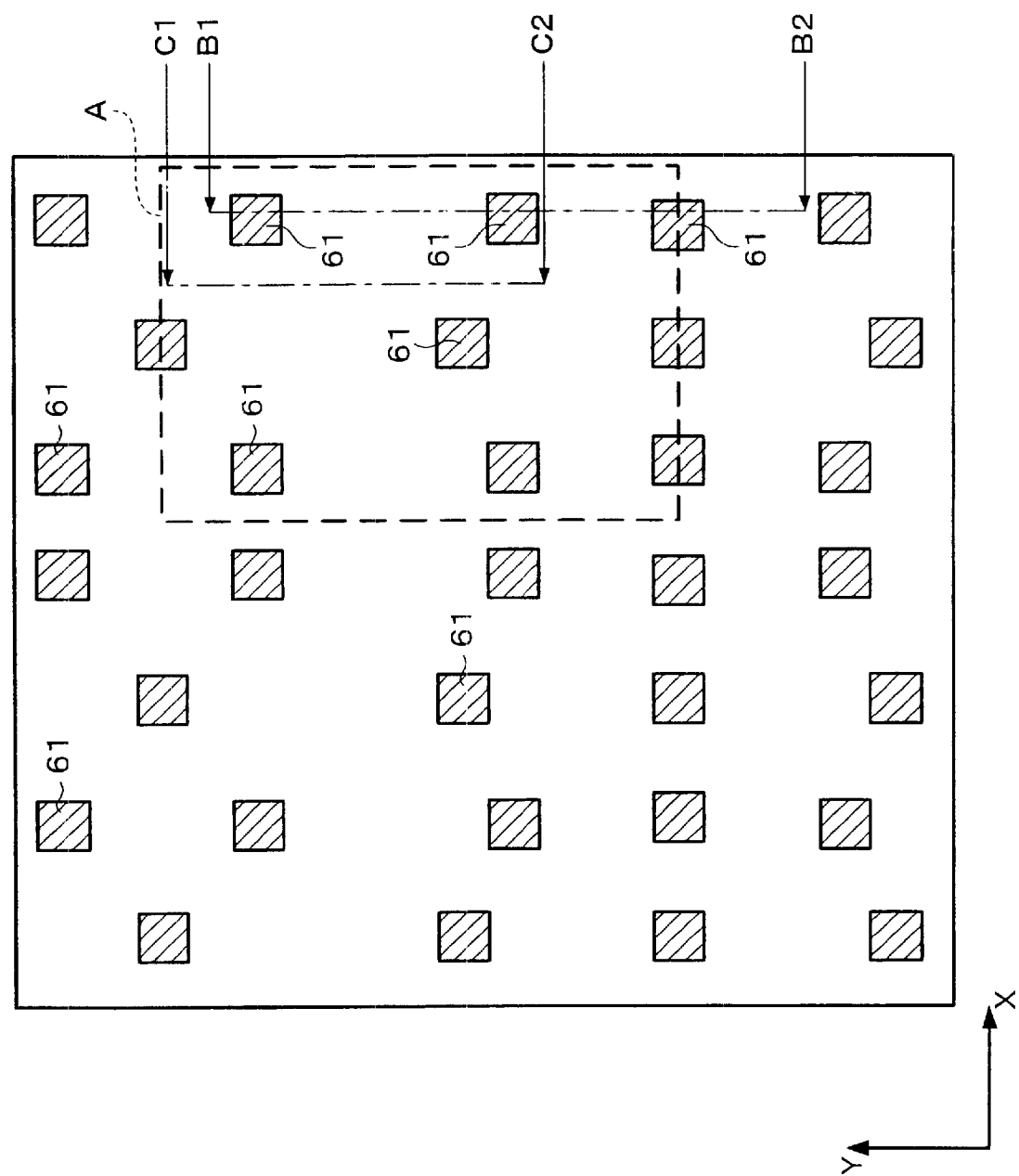
FIG. 4 is a plan view of plugs in this part of the memory cell array in accordance with this embodiment of the invention.

An interlayer dielectric layer (not shown in FIG. 11) of a material such as silicon oxide is formed so as to cover the field and the first layer. This interlayer dielectric 65 is subjected to a flattening process, such as CMP, as shown in FIGS. 14 and 15. A plurality of holes 63 are formed in the interlayer dielectric 65 so as to expose each n$^+$-type source/drain 11a, etc. Plugs 61 are embedded in these holes 63. The plugs 61 are connected to the n$^+$-type source/drains 11a, the p$^+$-type source/drains 13a, the n$^+$-type impurity region 15a, and the p$^+$-type impurity region 17a. The pattern of these plugs 61 on the surface is shown in FIG. 4. A material such as tungsten can be used for the plugs 61. Note that the dimension of upper end portions of the holes 63 is 0.30 µm and the dimension of lower end portions thereof is 0.24 µm, by way of example.

Second Conductive Layer

The second layer is positioned above the structure shown in FIG. 11. A plurality of the drain- drain contact layers 31a and 31b, a $V_{DD}$ wire 33, a plurality of BL (bit line, bit line/) contact pad layers 35a and 35b, and a plurality of local $V_{SS}$ wires 37 are disposed within the second conductive layer, as shown in FIG. 5. These components could be configured of an underlayer of titanium (of a thickness of 8.5 nm, for example) with a titanium nitride layer (of a thickness of 135 nm, for example) formed thereupon, by way of example.

Each of the drain- drain contact layers 31a and 31b has a linear shape that extends in the Y-axis direction in FIG. 5. The width of a main portion 31a3 of the drain- drain contact layer 31a is less than the widths of end portions 31a1 and 31a2 of the drain- drain contact layer 31a. Similarly, the width of a main portion 31b3 of the drain- drain contact layer 31b is less than the widths of end portions 31b1 and 31b2 of the drain- drain contact layer 31b. The widths of the main portion 31a3 and the main portion 31b3 are the minimum values permitted by the design rules. A pair of the drain- drain contact layers 31a and 31b is disposed in each memory cell region. As seen in plan as in FIG. 1, a pair of the gate electrode layers 21a and 21b is positioned between the drain- drain contact layer 31a and the drain- contact layer 31b.

Each of the local $V_{SS}$ wires 37 has a linear shape that extends in the Y-axis direction in FIG. 5, and is used for contact pad layer as well as local wire. The widths of end portions of each of the local $V_{SS}$ wires 37 is greater than the width of the main portion of the local $V_{SS}$ wire 37. The local $V_{SS}$ wire 37 is positioned between the end portion 31a2 of a drain- contact layer 31a and the end portion 31b2 of a drain- contact layer 31b. From that position, the local $V_{SS}$ wire 37 extends to between the end portion 31a2 of the drain- contact layer 31a of the memory cell positioned therebelow in FIG. 5 and the end portion 31b2 of the drain- contact layer 31b thereof. One local $V_{SS}$ wires 37 is disposed for every two memory cells.

The BL contact pad layers 35a function as pad layers for connecting together the bit lines and the n$^+$-type source/drains 11a (see FIG. 11). Similarly, the BL contact pad layers 35b function as pad layers for connecting together the bit line/ and the n$^+$-type source/drains 11a.

Each of the BL contact pad layers 35a is positioned between the drain- contact layer 31a of one memory cell and the drain- contact layer 31a of the memory cell positioned therebelow in FIG. 5. In a similar manner, each of the BL contact pad layers 35b is positioned between the drain-contact layer 31b of one memory cell and the drain-contact layer 31b of the memory cell positioned therebelow in FIG. 5. The BL contact pad layers 35a and 35b are disposed so that there is one each for every two memory cells.

The $V_{DD}$ wire 33 has a linear shape that extends in the X-axis direction in FIG. 5. The $V_{DD}$ wire 33 extends so as to cross the $n^+$-type impurity region 15a (see FIG. 11) on the different level. The $V_{DD}$ wire 33 has branch points 33a and 33b above the $n^+$-type impurity region 15a.

The drain-contact layers 31a and 31b, the $V_{DD}$ wire 33, BL contact pad layers 35a and 35b, and the local $V_{SS}$ wires 37 that are positioned in the second layer as shown in FIG. 5 are connected to the plugs 61 shown in FIG. 11. These connections are denoted by contact portions 61m in FIG. 5.

A section taken through the second layer along the line B1-B2 of FIG. 5 is shown in FIG. 14. This section shows the drain-contact layer 31b and the BL contact pad layers 35b.

An interlayer dielectric layer (not shown in FIG. 5) of a material such as silicon oxide is formed so as to cover the second layer. This interlayer dielectric 71 is subjected to a flattening process, such as CMP, as shown in FIGS. 14 and 15. A plurality of through-holes 79 are formed in the interlayer dielectric 71 so as to expose each drain-contact layer 31b, etc., as shown in FIG. 14. Plugs 75 are embedded in the through-holes 79. Through-holes 77 are formed in the interlayer dielectrics 71 and 65 to expose the gate electrode layers 21b, as shown in FIG. 15. Plugs 73 are embedded in the through-holes 77. The relationship between the plugs 73 and 75 in plan view is shown in FIG. 12.

Figure 6:
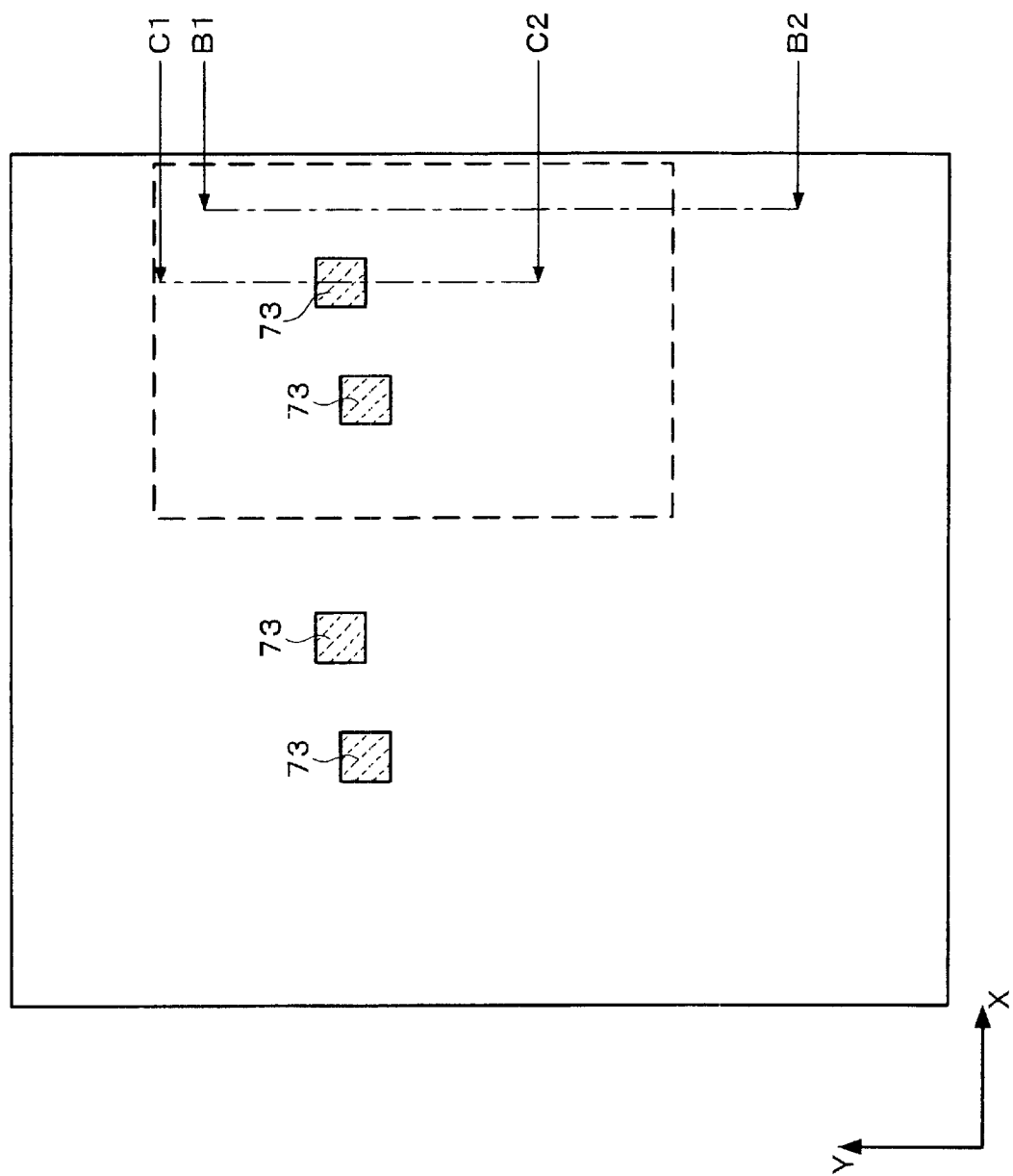
FIG. 6 is a plan view of plugs in this part of the memory cell array in accordance with this embodiment of the invention.

The description now turns to the plugs 73. The pattern of these plugs 73 on the surface is shown in FIG. 6. The plugs 73 are connected to the gate electrode layers 21a and 21b (see FIG. 3).

A section through one of the plugs 73 will now be described with reference to FIG. 15. Each plug 73 is embedded in one of the through-holes 77 that penetrates through the two interlayer dielectrics 65 and 71. In this section, the plug 73 is connected to the gate electrode layer 21b. A material such as tungsten can be used for the plugs 73. Note that the dimension of upper end portions of the through-holes 77 is 0.32 μm and the dimension of lower end portions thereof is 0.24 μm, by way of example.

Figure 7:
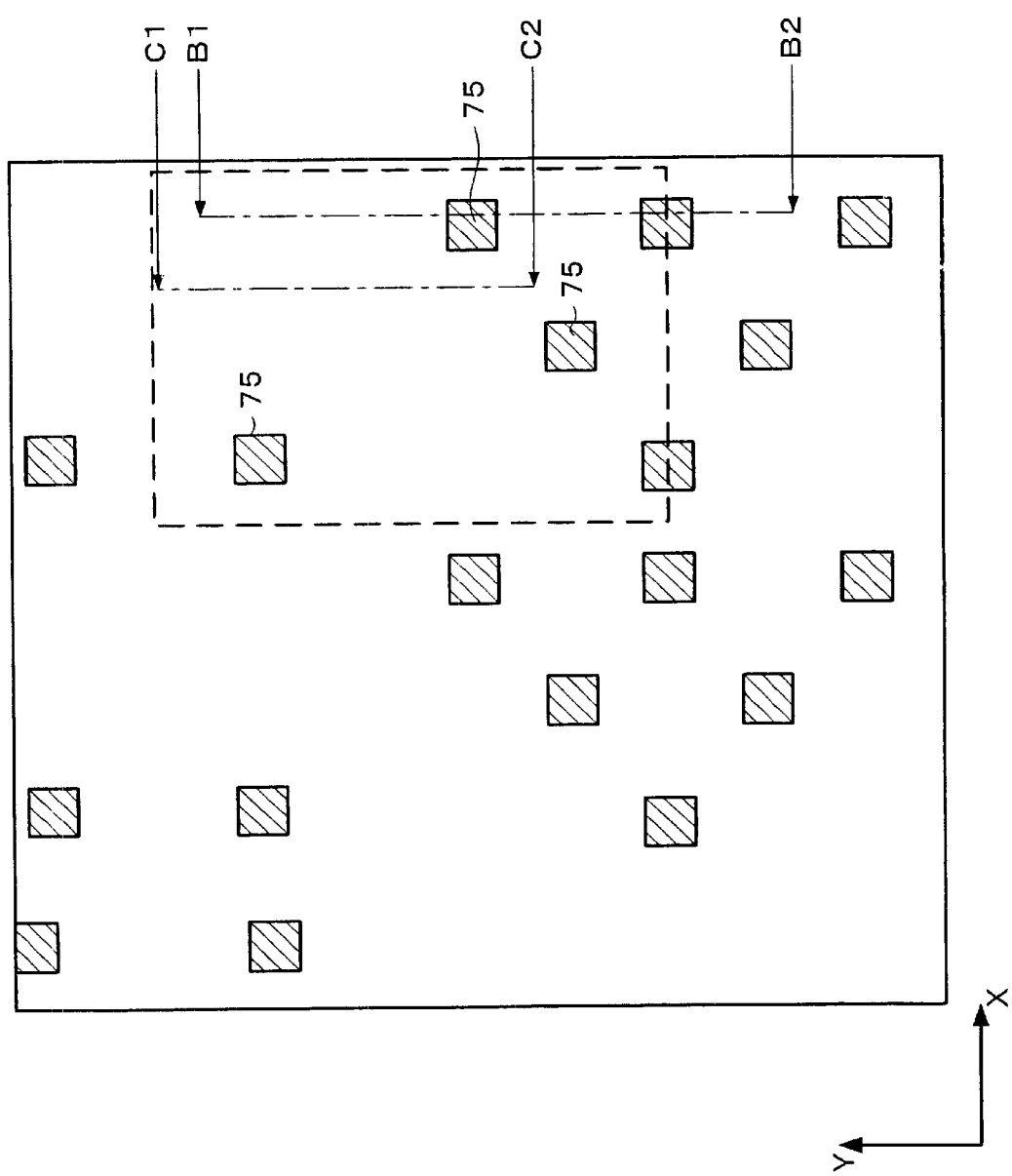
FIG. 7 is a plan view of plugs in this part of the memory cell array in accordance with this embodiment of the invention.

The description now turns to the plugs 75. The pattern of these plugs 75 on the surface is shown in FIG. 7. The plugs 75 are connected to the drain-contact layers 31a and 31b, the branch points 33a and 33b of the $V_{DD}$ wire 33, the BL contact pad layers 35a and 35b, and the local $V_{SS}$ wires 37, as shown in FIG. 12.

A section through the plugs 75 will now be described with reference to FIG. 14. In this section, the plugs 75 are connected to one of the drain-drain contact layers 31b and one of the BL contact pad layers 35b. A material such as tungsten can be used for the plugs 75. Note that the dimension of upper end portions of the through-holes 79 is 0.30 μm and the dimension of lower end portions thereof is 0.24 μm, by way of example.

Third Conductive Layer

The third layer is positioned above the structure shown in FIG. 12. The plurality of drain-gate contact layers 41a and 41b, a main word line 43, a plurality of BL contact pad layers 45a and 45b, a plurality of $V_{SS}$ contact pad layers 47, and a plurality of $V_{DD}$ contact pad layers 49 are disposed within the third conductive layer, as shown in FIG. 8. These components could be configured of an multi-layer stack of a titanium nitride layer, an aluminum-copper alloy layer, a titanium layer, and a titanium nitride layer, formed in that sequence from the bottom, by way of example.

Each drain-gate contact layer 41a has a main portion 41a3 and two end portions 41a1 and 41a2. The main portion 41a3 extends in the X-axis direction in FIG. 8. The first end portion 41a1 bends towards the corresponding drain-gate contact layer 41b. The first end portion 41a1 is connected to one of the plugs 73 shown in FIG. 12. The second end portion 41a2 is connected to one of the plugs 75 shown in FIG. 12.

Similarly, each drain-gate contact layer 41b has a main portion 41b3 and two end portions 41b1 and 41b2. The main portion 41b3 extends in the X-axis direction in FIG. 8. The first end portion 41bb bends towards the corresponding drain-gate contact layer 41a. This end portion 41bb is connected to one of the plugs 73 shown in FIG. 12. The second end portion 41b2 is connected to one of the plugs 75 shown in FIG. 12.

A pair of the drain-gate contact layers 41a and 41b is disposed within each memory cell region.

The BL contact pad layers 45a function as pad layers for connecting together the bit lines and the $n^+$-type source/drains 11a. Similarly, the BL contact pad layers 45b function as pad layers for connecting together the bit line/ and the $n^+$-type source/drains 11a. The BL contact pad layers 45a and 45b are disposed so that there is one each for every two memory cells.

Each of the $V_{SS}$ contact pad layers 47 extends in the X-axis direction in FIG. 8 and has two end portions. Each $V_{SS}$ contact pad layer 47 is positioned between a BL contact pad layer 45a and a BL contact pad layer 45b. The $V_{SS}$ contact pad layers 47 are disposed so that there is one for every two memory cells.

The main word line 43 extends in a linear fashion in the X-axis direction in FIG. 8. The main word line 43 is positioned above the $V_{DD}$ wire 33 shown in FIG. 5.

The $V_{DD}$ contact pad layers 49 are positioned above the branch points 33a and 33b of the $V_{DD}$ wire 33 shown in FIG. 5.

The first end portion 41a1 of each drain-gate contact layer 41a and the first end portion 41b1 of each drain-gate contact layer 41b are connected to the plugs 73 shown in FIG. 12. These connections are denoted by contact portions 73m in FIG. 8. The second end portion 41a2 of each drain-gate contact layer 41a, the second end portion 41b2 of each drain-gate contact layer 41b, the BL contact pad layers 45a and 45b, the $V_{SS}$ contact pad layers 47, and the $V_{DD}$ contact pad layers 49 are connected to the plugs 75 shown in FIG. 12. These connections are denoted by contact portions 75m in FIG. 8.

Sections taken through the third layer along the lines B1-B2 and C1-C2 of FIG. 8 are shown in FIG. 14 and FIG. 15, respectively. These sections show the drain-gate contact layers 41a and 41b, one of the BL contact pad layers 45b, and the main word line 43. The third conductive layer comprising these components is formed by a hard mask layer 40 formed of a silicon oxide layer. The hard mask layer 40 acts as a mask for the patterning of the third conductive layer. When resist is used as the mask, a reduction in size of the memory cell will make it difficult to pattern that third conductive layer.

Figure 9:
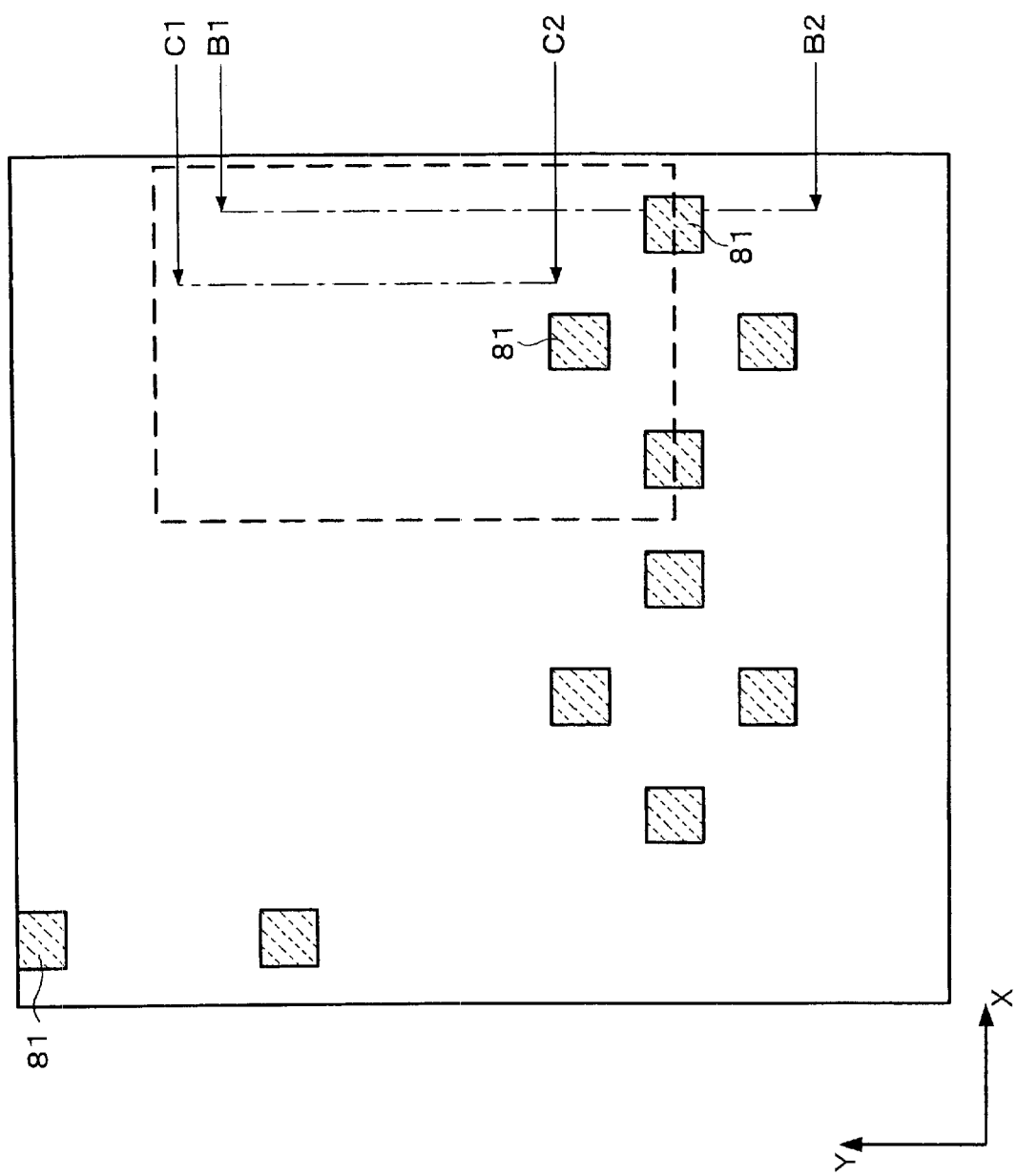
FIG. 9 is a plan view of plugs in this part of the memory cell array in accordance with this embodiment of the invention.

An interlayer dielectric layer of a material such as silicon oxide is formed so as to cover the third layer. This interlayer dielectric 85 is subjected to a flattening process, such as CMP, as shown in FIGS. 14 and 15. Through-holes 83 are formed in the interlayer dielectric 85 so as to expose each BL contact pad layer 45a, etc. Plugs 81 are embedded in the through-holes 83. A plan view thereof is shown in FIG. 13. The plugs 81 are connected to the BL contact pad layers 45a and 45b, the V$_{SS}$ contact pad layers 47, and the V$_{DD}$ contact pad layers 49, as shown in FIG. 13. The pattern of these plugs 81 on the surface is shown in FIG. 9. A material such as tungsten is used for the plugs 81. Note that the dimension of upper end portions of the through-holes 83 is 0.36 μm and the dimension of lower end portions thereof is 0.28 μm, by way of example.

Fourth Conductive Layer

The fourth layer is positioned above the structure shown in FIG. 13. A plurality of bit lines 51, a plurality of bit lines/53, a plurality of V$_{SS}$ wires 55, and a V$_{DD}$ wire 57 are disposed within the fourth layer, as shown in FIG. 10. These extend in a linear fashion in the Y-axis direction in FIG. 10. Each of these components is connected to one of the plugs 81 shown in FIG. 13. These connections are denoted by contact portions 81m in FIG. 10. The bit lines 51 could be configured of an multi-layer stack of a titanium nitride layer, an aluminum-copper alloy layer, and a titanium nitride layer, formed in that sequence from the bottom, by way of example.

A section taken through the fourth layer along the line B1-B2 of FIG. 10 is shown in FIG. 14. This section shows the bit lines/53. Signals that complement the signals that flow through the bit lines 51 flow through the bit lines/53.

Figure 16:
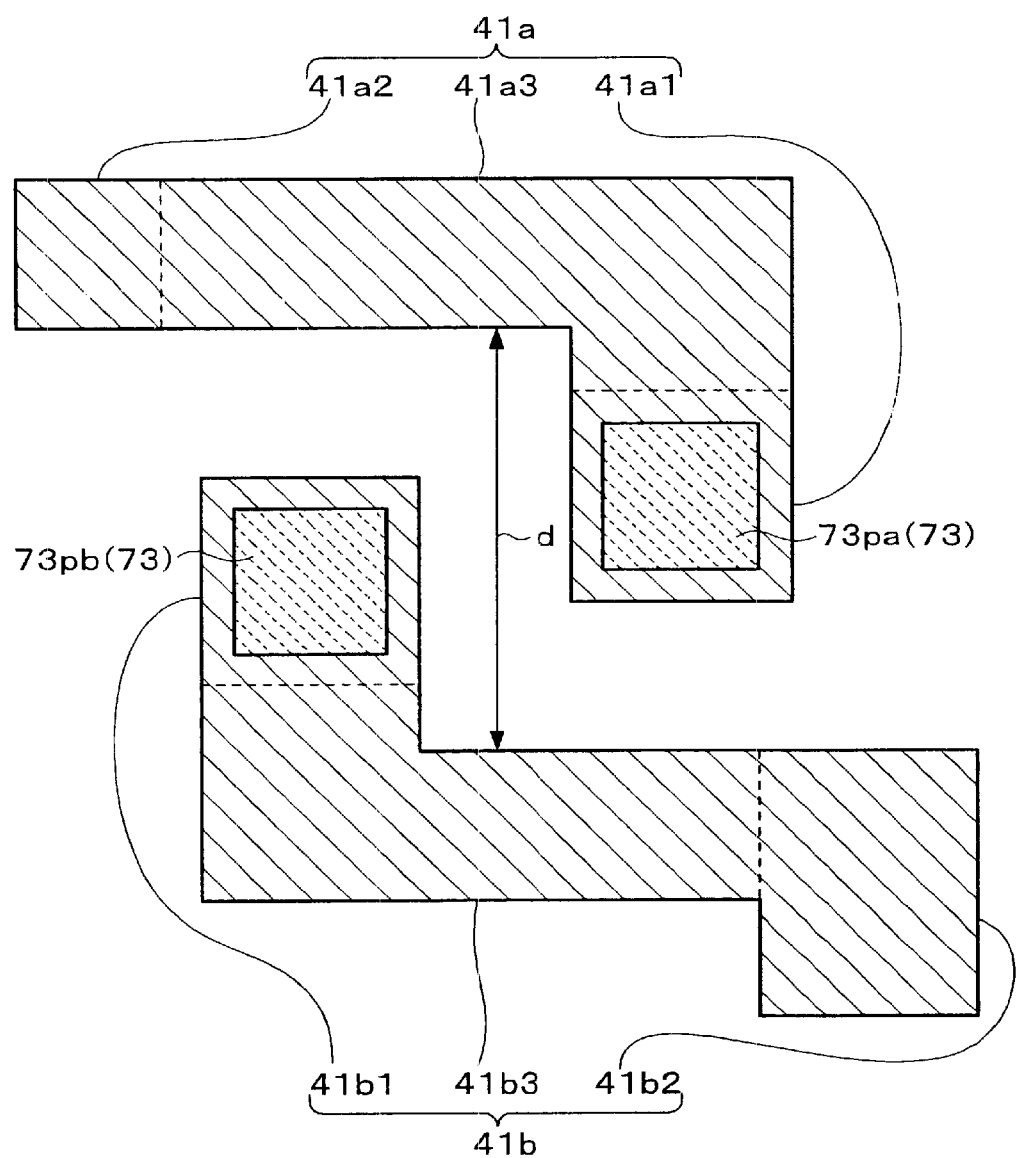
FIG. 16 is a plan view of drain-gate contact layers and the plugs of this embodiment of the invention.

This completes the description of the configuration of this embodiment of the invention. This embodiment makes it possible to reduce the distance between the main portion 41a3 and the main portion 41b3 shown in FIG. 8. The reasons therefor will now be described with reference to FIG. 16. FIG. 16 is a plan view of the drain-gate contact layers 41a and 41b and the plugs 73. In this figure, the plug 73 that is connected to the drain-gate contact layer 41a is denoted by plug 73pa and the plug 73 that is connected to the drain-gate contact layer 41b is denoted by plug 73pb.

The plugs 73pa and 73pb are positioned in a region between the main portion 41a3 and the main portion 41b3. The plug 73pa is closer to the main portion 41a3 than the plug 73pb. Similarly, the plug 73pb is closer to the main portion 41b3 than the plug 73pa. Thus the distance between the drain-gate contact layer 41a and the drain-gate contact layer 41b can be made smaller than in a case in which the plug 73pa and the plug 73pb are arrayed in a straight line in the X-axis direction. In other words, the distance "d" between the main portion 41a3 and the main portion 41b3 can be made smaller while maintaining a spacing such that the plug 73pa is not superimposed upon the main portion 41b3 and a spacing such that the plug 73pb is not superimposed upon the main portion 41a3. This leads to the reduction in the memory cell size.

Another way in which this embodiment makes it possible to reduce the memory cell size relates to the following point. If the plug 73pa and the plug 73pb shown in FIG. 16 are separated in such a manner that they do not overlap when viewed in the Y-axis direction, restrictions on the distance between the plug 73pa and the load transistor Q$_6$ and the distance between the plug 73pb and the load transistor Q$_3$ will increase the distance between the load transistor and the drive transistor. Since this embodiment of the invention allows the plug 73pa and the plug 73pb to overlap when viewed in the Y-axis direction so that the distance between the load transistor and the drive transistor can be made smaller than in the above case. This enables a reduction in the memory cell size in accordance with this embodiment of the invention.

Note that the patterns shown in FIGS. 1 to 13 and 16 are governed by the design. These patterns have corner portions. However, optical proximity effects will dictate that the corner portions of patterns formed on a semiconductor substrate in practice will be curved.

What is claimed is:

1. A semiconductor memory device which stores data by a flip-flop configured of a first inverter and a second inverter, the semiconductor memory device comprising:

a first gate electrode layer and a second gate electrode layer;

a first drain- contact layer and a second drain- contact layer; and a first drain-gate contact layer and a second drain-gate contact layer, wherein each of the first and second inverters comprises a load transistor and a drive transistor, wherein each of the first and second gate electrode layers comprises gate electrodes of the load transistor and the drive transistor, wherein each of the first and second drain- contact layers connects a drain of the load transistor to a drain of the drive transistor, wherein the first and second gate electrode layers are positioned between the first drain- contact layer and the second drain- contact layer, wherein the first drain-gate contact layer connects the first drain- contact layer to the second gate electrode layer, wherein the second drain-gate contact layer connects the second drain- contact layer to the first gate electrode layer, and wherein the first and second drain-gate contact layers, the first and second drain- contact layers, and the first and second gate electrode layers are each formed in different layers.

2. The semiconductor memory device as defined in claim 1, wherein the first gate electrode layer, the second gate electrode layer, the first drain- contact layer, and the second drain- contact layer are disposed to be mutually parallel and each forms a linear pattern.

3. The semiconductor memory device as defined in claim 1, further comprising:

a first contact conductive portion and a second contact conductive portion, wherein the first contact conductive portion is formed in a hole and is connected to the second gate electrode layer, wherein the second contact conductive portion is formed in a hole and is connected to the first gate electrode layer, wherein the first drain-gate contact layer is connected to the first contact conductive portion, wherein the second drain-gate contact layer is connected to the second contact conductive portion, wherein the first and second contact conductive portions are positioned between the first drain-gate contact layer and the second drain-gate contact layer, wherein the first contact conductive portion is positioned closer to the first drain-gate contact layer than the second contact conductive portion, and wherein the second contact conductive portion is positioned closer to the second drain-gate contact layer than the first contact conductive portion.

4. The semiconductor memory device as defined in claim 1, wherein each of the first and second drain-gate contact layers has a pattern including a first side and a second side, wherein a first side of the first drain-gate contact layer faces a first side of the second drain-gate contact layer, and wherein a second side of the first drain-gate contact layer faces a second side of the second drain-gate contact layer.

5. The semiconductor memory device as defined in claim 1, wherein the load transistor is a p-type transistor, wherein the drive transistor is an n-type transistor, and wherein an n-type of transfer transistor is further provided.

6. The semiconductor memory device as defined in claim 5, further comprising:

a first conductive layer, a second conductive layer, a third conductive layer, and a fourth conductive layer, wherein the first conductive layer includes:
the gate electrode layer; and
a sub word line extending in a first direction, wherein the second conductive layer includes:
the drain- contact layer;
a power line connected to the load transistor;
a first contact pad layer used for connecting a bit line to an n-type source/drain of the transfer transistor; and
a second contact pad layer used for connecting a ground line to a p-type well and to an n-type source of the drive transistor, wherein the third conductive layer includes:
the drain-gate contact layer;
a main word line extending in the first direction;
a third contact pad layer used for connecting the bit line to the n-type source/drain of the transfer transistor; and
a fourth contact pad layer used for connecting the ground line to the p-type well and the n-type source of the drive transistor, and wherein the fourth conductive layer includes:
the bit line extending in a second direction that is perpendicular to the first direction; and
the ground line.

7. The semiconductor memory device as defined in claim 1, wherein a memory cell size is 4.5 µm or less.

8. The semiconductor memory device as defined in claim 2, wherein each of the first and second drain-gate contact layers has a pattern including a first side and a second side, wherein a first side of the first drain-gate contact layer faces a first side of the second drain-gate contact layer, and wherein a second side of the first drain-gate contact layer faces a second side of the second drain-gate contact layer.

9. The semiconductor memory device as defined in claim 8, wherein the load transistor is a p-type transistor, wherein the drive transistor is an n-type transistor, and wherein an n-type of transfer transistor is further provided.

10. The semiconductor memory device as defined in claim 9, further comprising:

a first conductive layer, a second conductive layer, a third conductive layer, and a fourth conductive layer, wherein the first conductive layer includes:
the gate electrode layer; and
a sub word line extending in a first direction, wherein the second conductive layer includes:
the drain- contact layer;
a power line connected to the load transistor;
a first contact pad layer used for connecting a bit line to an n-type source/drain of the transfer transistor; and
a second contact pad layer used for connecting a ground line to a p-type well and to an n-type source of the drive transistor, wherein the third conductive layer includes:
the drain-gate contact layer;
a main word line extending in the first direction;
a third contact pad layer used for connecting the bit line to the n-type source/drain of the transfer transistor; and
a fourth contact pad layer used for connecting the ground line to the p-type well and the n-type source of the drive transistor, and wherein the fourth conductive layer includes:
the bit line extending in a second direction that is perpendicular to the first direction; and
the ground line.

11. A semiconductor memory device having a memory cell that includes a plurality of transfer transistors and a flip-flop configured of a first inverter and a second inverter, the semiconductor memory device comprising:

a first gate electrode layer and a second gate electrode layer;

a first drain- drain contact layer and a second drain- drain contact layer; and a first drain-gate contact layer and a second drain-gate contact layer, wherein each of the first and second inverters comprises a load transistor and a drive transistor, wherein each of the first and second gate electrode layers comprises gate electrodes of the load transistor and the drive transistor, wherein each of the first and second drain- drain contact layers connects a drain of the load transistor to a drain of the drive transistor, wherein the first and second gate electrode layers are positioned between the first drain- drain contact layer and the second drain- drain contact layer, wherein the first drain-gate contact layer connects the first drain- drain contact layer to the second gate electrode layer, wherein the second drain-gate contact layer connects the second drain- drain contact layer to the first gate electrode layer, and wherein the first and second drain-gate contact layers, the first and second drain- drain contact layers, and the first and second gate electrode layers are each formed in different layers.

12. The semiconductor memory device as defined in claim 11, wherein the first gate electrode layer, the second gate electrode layer, the first drain- drain contact layer, and the second drain- drain contact layer are disposed to be mutually parallel and each forms a linear pattern.

13. The semiconductor memory device as defined in claim 11, further comprising:

a first contact conductive portion and a second contact conductive portion, wherein the first contact conductive portion is formed in a hole and is connected to the second gate electrode layer, wherein the second contact conductive portion is formed in a hole and is connected to the first gate electrode layer, wherein the first drain-gate contact layer is connected to the first contact conductive portion, wherein the second drain-gate contact layer is connected to the second contact conductive portion, wherein the first and second contact conductive portions are positioned between the first drain-gate contact layer and the second drain-gate contact layer, wherein the first contact conductive portion is positioned closer to the first drain-gate contact layer than the second contact conductive portion, and wherein the second contact conductive portion is positioned closer to the second drain-gate contact layer than the first contact conductive portion.

14. The semiconductor memory device as defined in claim 11, wherein each of the first and second drain-gate contact layers has a pattern including a first side and a second side, wherein a first side of the first drain-gate contact layer faces a first side of the second drain-gate contact layer, and wherein a second side of the first drain-gate contact layer faces a second side of the second drain-gate contact layer.

15. The semiconductor memory device as defined in claim 11, wherein the load transistor is a p-type transistor, wherein the drive transistor is an n-type transistor, and wherein the transfer transistor is an n-type transistor.

16. The semiconductor memory device as defined in claim 15, further comprising:

a first conductive layer, a second conductive layer, a third conductive layer, and a fourth conductive layer, wherein the first conductive layer includes:
the gate electrode layer; and
a sub word line extending in a first direction, wherein the second conductive layer includes:
the drain- drain contact layer;
a power line connected to the load transistor;
a first contact pad layer used for connecting a bit line to an n-type source/drain of the transfer transistor; and
a second contact pad layer used for connecting a ground line to a p-type well and to an n-type source of the drive transistor, wherein the third conductive layer includes:
the drain-gate contact layer;
a main word line extending in the first direction;
a third contact pad layer used for connecting the bit line to the n-type source/drain of the transfer transistor; and
a fourth contact pad layer used for connecting the ground line to the p-type well and the n-type source of the drive transistor, and wherein the fourth conductive layer includes:
the bit line extending in a second direction that is perpendicular to the first direction; and
the ground line.

17. The semiconductor memory device as defined in claim 11, wherein a memory cell size is 4.5 $\mu$m or less.

18. The semiconductor memory device as defined in claim 12, wherein each of the first and second drain-gate contact layers has a pattern including a first side and a second side, wherein a first side of the first drain-gate contact layer faces a first side of the second drain-gate contact layer, and wherein a second side of the first drain-gate contact layer faces a second side of the second drain-gate contact layer.

19. The semiconductor memory device as defined in claim 18, wherein the load transistor is a p-type transistor, wherein the drive transistor is an n-type transistor, and wherein the transfer transistor is an n-type transistor.

20. The semiconductor memory device as defined in claim 19, further comprising:

a first conductive layer, a second conductive layer, a third conductive layer, and a fourth conductive layer, wherein the first conductive layer includes:
the gate electrode layer; and
a sub word line extending in a first direction, wherein the second conductive layer includes:
the drain-gate contact layer;
a power line connected to the load transistor;
a first contact pad layer used for connecting a bit line to an n-type source/drain of the transfer transistor; and
a second contact pad layer used for connecting a ground line to a p-type well and to an n-type source of the drive transistor, wherein the third conductive layer includes:
the drain-gate contact layer;
a main word line extending in the first direction;
a third contact pad layer used for connecting the bit line to the n-type source/drain of the transfer transistor; and
a fourth contact pad layer used for connecting the ground line to the p-type well and the n-type source of the drive transistor, and wherein the fourth conductive layer includes:
the bit line extending in a second direction that is perpendicular to the first direction; and
the ground line.

* * * * *